United States Patent [19]
Urabe

[11] Patent Number: 5,998,871
[45] Date of Patent: Dec. 7, 1999

[54] METAL PLUG ELECTRODE IN SEMICONDUCTOR DEVICE AND METHOD FOR FORMING THE SAME

[75] Inventor: Koji Urabe, Tokyo, Japan

[73] Assignee: NEC Corporation, Japan

[21] Appl. No.: 09/027,346

[22] Filed: Feb. 20, 1998

[30] Foreign Application Priority Data

Feb. 20, 1997 [JP] Japan .................................. 9-036407

[51] Int. Cl.$^6$ .................................................. H01L 29/43
[52] U.S. Cl. .......................... 257/754; 257/757; 257/763; 438/630
[58] Field of Search .................... 257/377, 384, 257/751, 752, 754, 755, 757, 763, 764; 438/630, 648, 649, 650, 651, 655, 656

[56] References Cited

U.S. PATENT DOCUMENTS

| | | | |
|---|---|---|---|
| 5,381,302 | 1/1995 | Sandhu et al. | 361/305 |
| 5,581,093 | 12/1996 | Sakamoto | 257/67 |
| 5,612,574 | 3/1997 | Summerfelt et al. | 257/783 |
| 5,700,716 | 12/1997 | Sharan et al. | 438/655 |
| 5,763,321 | 6/1998 | Ohshima et al. | 438/618 |
| 5,763,923 | 6/1998 | Hu et al. | 257/382 |

FOREIGN PATENT DOCUMENTS

| | | | |
|---|---|---|---|
| 2-83978 | 3/1990 | Japan | 257/751 |
| 2-280378 | 11/1990 | Japan | 257/764 |
| 6260455 | 9/1994 | Japan . | |

OTHER PUBLICATIONS

Lee et al., "Simultaneously Formed Storage Node Contact and Metal Contact Cell (SSMC) for 1Gb DRAM and Beyond", 1996 IEEE IEDM Tech. Dig., Dec. 1996, pp. 593–596.

Raaijmakers, I., et al., "Contact Hole Fill with Low Temperature LPCVD TiN", VMIC Conf., Jun. 12–13, 1990, pp. 219–225.

Wolf, S., Silicon Processing for the VLSI Era, vol. 2, Lattice Press, 1990, pp. 183–186.

*Primary Examiner*—T. N. Quach
*Attorney, Agent, or Firm*—Hayes, Soloway, Hennessey, Grossman, Hage, P.C.

[57] ABSTRACT

A semiconductor device, has a TiN plug is formed to filled up a contact hole which is formed to penetrate through an insulator film on a conductive silicon layer in a surface region of a silicon substrate. A first titanium silicide film is formed on a bottom surface of the TiN plug, so that the TiN plug is electrically connected to the conductive silicon layer through the first titanium silicide film. A second titanium silicide film is formed on a top surface of the TiN plug, and a polysilicon electrode is formed on the second titanium silicide film, so that the TiN plug is electrically connected to the polysilicon electrode through the second titanium silicide film. Thus, the contact resistance between the TiN plug and the polysilicon electrode is reduced.

7 Claims, 3 Drawing Sheets

METAL PLUG ELECTRODE IN SEMICONDUCTOR DEVICE AND METHOD FOR FORMING THE SAME

BACKGROUND OF THE INVENTION

1. Field of the Invention

The present invention relates to a semiconductor device and a method for manufacturing the same, and more specifically to a metal plug electrode used in a semiconductor device and a method for forming the same.

2. Description of Related Art

In a method for forming an electrode or an interconnection composed of titanium silicide film, in a semiconductor device, an example of the method for connecting between a polysilicon layer and a titanium nitride plug will be described with reference to FIGS. 1A and 1B.

As shown in FIG. 1A, an insulator film 2 is formed on a silicon substrate 1 in which various semiconductor circuit elements (not shown) are formed. A silicon conductive layer 1A formed in a surface region of the silicon substrate 1 constitutes a portion of one of the semiconductor circuit elements. A contact hole 3 is formed to penetrate through the insulator film 2 and to reach the surface of the silicon conductive layer 1A. A titanium film 4 is formed at a bottom of the contact hole 3, to contact with the surface of the silicon conductive layer 1A and furthermore, a titanium nitride film is formed to fill up the contact hole 3 and to cover the insulator film 2. Thereafter, the titanium nitride film is removed from the planar upper surface of the insulator film 2, so that a titanium nitride plug 5 filling up the contact hole 3 is formed.

Then, as shown in FIG. 1B, a polysilicon electrode 6 doped with a predetermined impurity is formed on the insulator film 2 and the titanium nitride plug 5.

However, the above mentioned prior art metal plug electrode is disadvantageous in that the contact resistance between the polysilicon electrode 6 and the titanium nitride plug 5 is large, and therefore, a stable operation of the semiconductor device and a high yield of production cannot be obtained.

SUMMARY OF THE INVENTION

Accordingly, it is an object of the present invention to provide a metal plug electrode used in a semiconductor device, which has overcomes the above mentioned defect of the conventional one.

Another object of the present invention is to provide a metal plug electrode used in a semiconductor device and having a low contact resistance between a metal plug and a polysilicon electrode formed thereon, so that the semiconductor device can have a stable operation and a high yield of production.

Still another object of the present invention is to provide a method for forming the above mentioned metal plug electrode in a semiconductor device.

The above and other objects of the present invention are achieved in accordance with the present invention by a semiconductor device including a first conductive silicon layer, an insulator layer formed to cover the first conductive silicon layer, a contact hole formed to penetrate through the insulator layer to reach a surface of the first conductive silicon layer, a conductive body formed to fill up the contact hole, and an electrode formed on the conductive body, the conductive body including first and second silicide films formed on a bottom surface and a top surface of the conductive body respectively, so that the conductive body is electrically connected to the first conductive silicon layer through the first side film and to the electrode through the second silicide film.

For example, the conductive body is formed of a material selected from the group consisting of titanium nitride and tungsten. The silicide films are formed of a material selected from the group consisting of titanium silicide and tungsten silicide.

In a preferred embodiment, the conductive body is formed of titanium nitride, the silicide films are formed of titanium silicide, and the electrode is formed of a second conductive silicon layer.

In another preferred embodiment, the conductive body is formed of titanium nitride, the first and second silicide films are formed of titanium silicide and tungsten silicide, respectively, and the electrode is formed of a second conductive silicon layer.

According to another aspect of the present invention, there is provided a method for forming a semiconductor device, including the steps of:

forming a first silicide film on a bottom of a contact hole which is formed to penetrate through an insulator layer formed on a first conductive silicon layer so as to expose a surface of the first conductive silicon layer;

depositing a conductive film on the first silicide film within the contact hole to fill up the contact hole with the conductive film;

forming a metal layer on the conductive film filling up the contact hole; and forming a second conductive silicon layer on the metal layer and causing the metal layer to react with the second conductive silicon layer so as to form a second silicide film between the second conductive silicon layer and the conductive film filling up the contact hole.

For example, the metal layer is selectively formed on the conductive film by a chemical vapor deposition process. The conductive film is formed of a material selected from the group consisting of titanium nitride and tungsten. The silicide films are formed of a material selected from the group consisting of titanium silicide and tungsten silicide.

In a preferred embodiment, the conductive film is formed of titanium nitride, the first silicide film is formed of titanium silicide, and the metal layer is formed of titanium. After the second conductive silicon layer is formed, a heating treatment is carried out to cause the metal layer formed of titanium to react with the second conductive silicon layer to form the second silicide film of titanium silicide.

In another preferred embodiment, the conductive film is formed of titanium nitride, the first silicide film is formed of titanium silicide, and the metal layer is formed of tungsten After the second conductive silicon layer is formed, a heating treatment is carried out to cause the metal layer formed of tungsten to react with the second conductive silicon layer to form the second silicide film of tungsten silicide.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the present invention will be described with reference to the accompanying drawings.

Figure 1A:
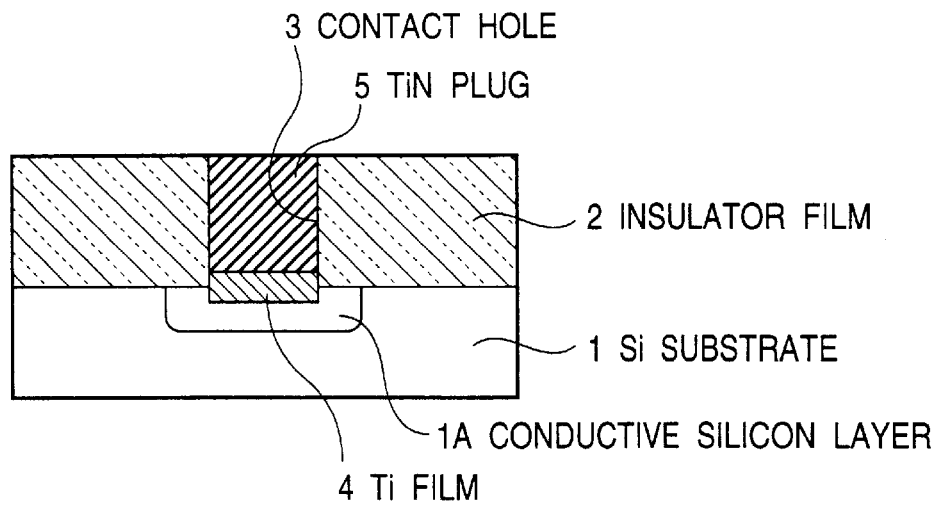
FIGS. 1A and 1B are diagrammatic sectional views of a prior art metal plug electrode, for illustrating a prior art process for forming a prior art metal plug electrode.
Figure 1B:
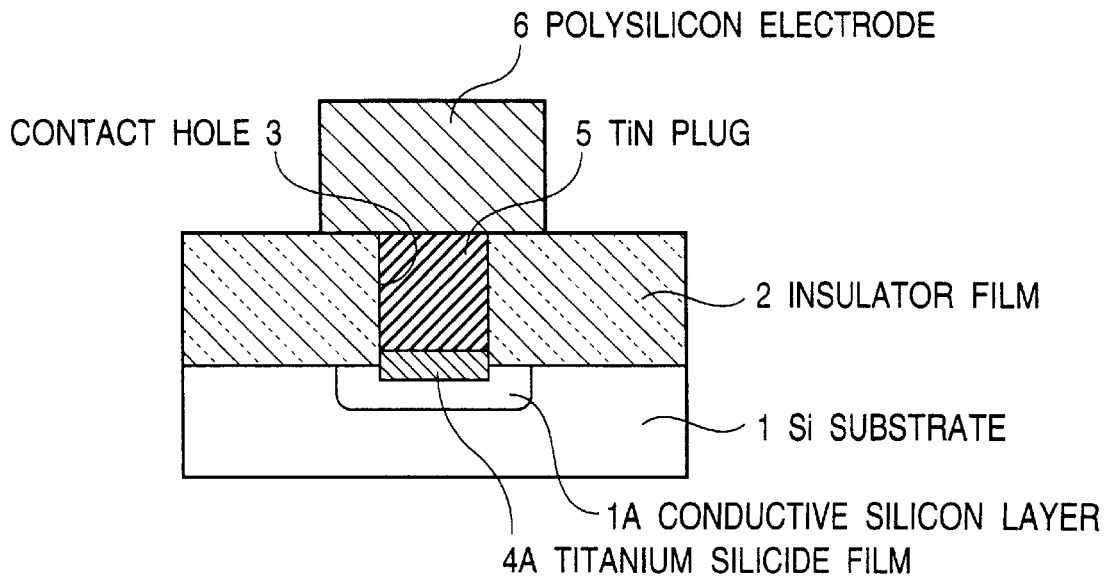
Figure 2A:
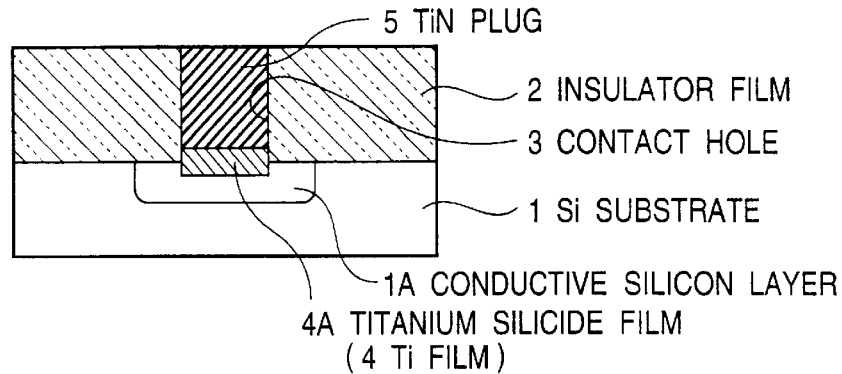
FIGS. 2A to 2D are diagrammatic sectional views of a first embodiment of a metal plug electrode in accordance with the present invention, for illustrating a first embodiment of a process in accordance with a present invention for forming the metal plug electrode.
Figure 2B:
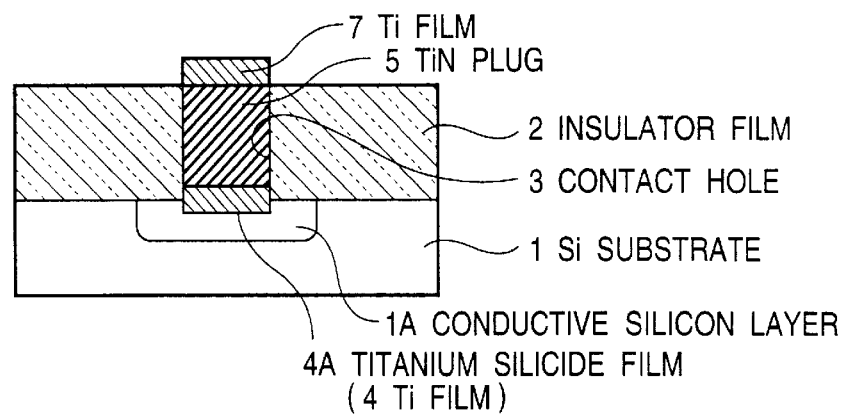
Figure 2C:
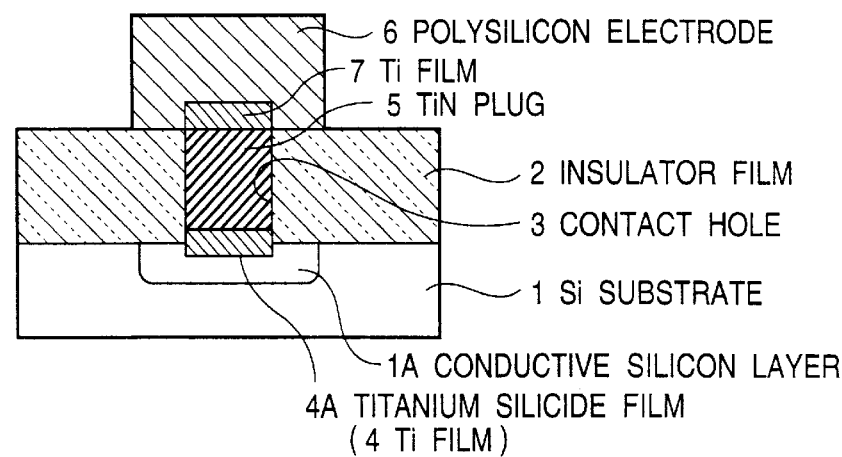
Figure 2D:
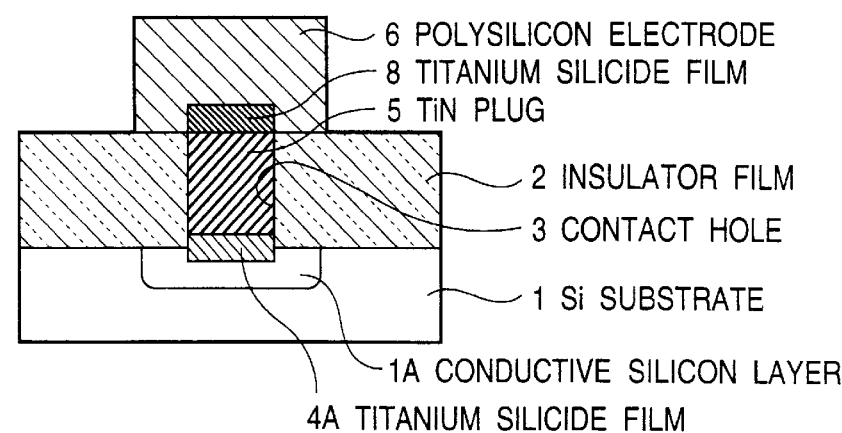

Referring to FIG. 2D, there is shown a diagrammatic sectional view of a first embodiment of a metal plug electrode in accordance with the present invention. The first embodiment includes a silicon substrate 1 in which various semiconductor circuit elements (not shown) are formed and a silicon conductive layer 1A formed in a surface region of the silicon substrate 1 constitutes a portion of one of the semiconductor circuit elements. The shown embodiment also includes an insulator film 2 formed on the silicon substrate 1 to cover the first silicon conductive layer 1A and the surface of the silicon substrate 1, and a contact hole 3 formed to penetrate through the insulator film 2 and to reach the surface of the first silicon conductive layer 1A.

Furthermore, the shown embodiment includes a conductive plug (for example, a titanium nitride plug) 5 filled in the contact hole 3 and having silicide layers 4A and 8 formed on a bottom surface and a top surface of the conductive plug 5 so that the conductive plug 5 is electrically connected through the silicide layer 4A to the first silicon conductive layer 1A, and a polysilicon electrode 6 formed to cover the silicide layer 8 and a surface of the insulator film 3 in the neighborhood of the conductive plug 5. Thus, the polysilicon electrode 6 is electrically connected through the silicide layer 8 to the conductive plug 5.

Here, for example, the first silicon conductive layer 1A constitutes one of a pair of diffused regions of the transistor of a memory cell in a DRAM, and the polysilicon electrode 6 constitutes a storage node of the capacitor of the same memory cell in the DRAM.

Next, the process for forming the above mentioned metal plug electrode will be described with reference to FIGS. 2A to 2D. In FIGS. 2A to 2C, elements similar to those shown in FIG. 2D are given the same Reference Numerals.

As shown in FIG. 2A, the insulator film 2 is formed on the silicon substrate 1 in which various semiconductor circuit elements (not shown) are formed and the first silicon conductive layer 1A formed in a surface region of the silicon substrate 1 constitutes a portion of one of the semiconductor circuit elements. The contact hole 3 is formed to penetrate through the insulator film 2 and to reach the surface of the first silicon conductive layer 1A. Thereafter, a titanium film 4 is formed at a bottom of the contact hole 3, to directly contact with the surface of the first silicon conductive layer 1A within the contact hole 3, and furthermore, a titanium nitride film is formed to fill up the contact hole 3 and to cover the insulator film 2. Thereafter, the titanium nitride film is removed from the planar upper surface of the insulator film 2, so that a titanium nitride plug 5 filling up the contact hole 3 is formed. Here, the titanium film 4 reacts with the silicon of the substrate so that a titanium silicide film 4A is formed between the titanium nitride plug 5 and the first silicon conductive layer 1A.

Then, as shown in FIG. 2B, a titanium film 7 having a thickness of 10 nm is selectively formed on the titanium nitride plug 5 by means of a plasma chemical vapor deposition process carried out under the condition in which the substrate temperature is 600° C., the flow rate of titanium tetrachloride ($TiCl_4$) is 5 sccm, the flow rate of hydrogen is 500 sccm, the flow rate of argon is 3000 sccm, and the pressure is 5 Torr.

Thereafter, as shown in FIG. 2C, a polysilicon electrode 6 doped with a predetermined impurity is formed on the titanium film 7 and the insulator film 2 in the neighborhood of the titanium film 7.

Furthermore, a predetermined heating treatment is conducted to cause the titanium film 7 to react with the polysilicon electrode 6, thereby to form a titanium silicide film 8, as shown in FIG. 2D. Thus, the polysilicon electrode 6 is electrically connected through the titanium silicide film 8 to the titanium nitride plug 5, without directly contacting the polysilicon electrode 6. In this case, the contact resistance between the polysilicon electrode 6 and the titanium nitride plug 5 becomes remarkably smaller than the prior art in which the polysilicon electrode 6 is in direct contact with the titanium nitride plug 5.

Figure 3A:
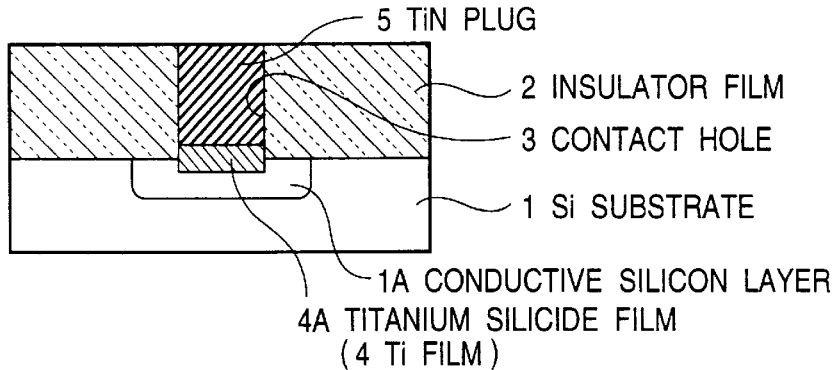
FIGS. 3A to 3D are diagrammatic sectional views of a second embodiment of a metal plug electrode in accordance with the present invention, for illustrating a second embodiment of a process in accordance with the present invention for forming a metal plug electrode.
Figure 3B:
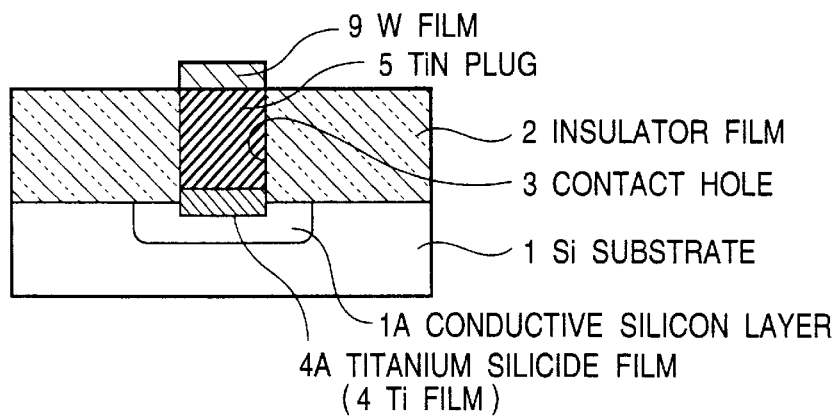
Figure 3C:
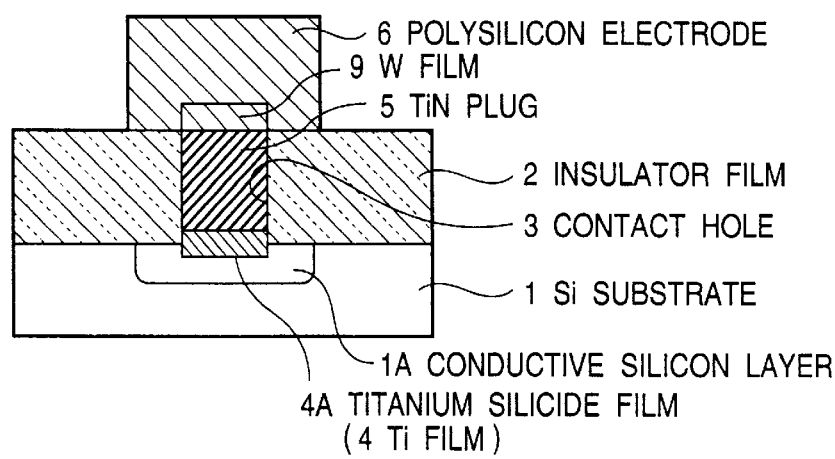
Figure 3D:
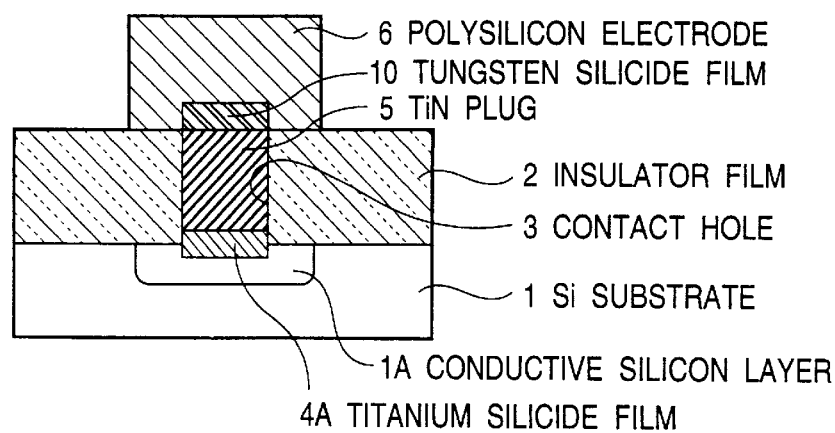

Referring to FIG. 3D, there is shown a diagrammatic sectional view of a second embodiment of the metal plug electrode in accordance with the present invention. In FIG. 3D, elements similar to those shown in FIG. 2D are given the same Reference Numerals. The second embodiment includes a silicon substrate 1 in which various semiconductor circuit elements (not shown) are formed, an insulator film 2 formed on the silicon substrate 1 to cover a first silicon conductive layer 1A formed in a surface region of the silicon substrate 1, a contact hole 3 formed to penetrate through the insulator film 2 and to reach the surface of the first silicon conductive layer 1A, a conducting plug (for example, a titanium nitride plug) 5 filled in the contact hole 3 and having silicide layers 4A and 10 formed on a bottom surface and a top surface of the conducting plug 5 so that the conducting plug 5 is electrically connected through the silicide layer 4A to the first silicon conductive layer 1A, and a polysilicon electrode 6 formed to cover the silicide layer 10 and a surface of the insulator film 3 in the neighborhood of the conducting plug 5. Thus, the polysilicon electrode 6 is electrically connected through the silicide layer 10 to the conducting plug 5.

Next, the process for forming the above mentioned metal plug electrode will be described with reference to FIGS. 3A to 3D. In FIGS. 3A to 3D, elements similar to those shown in FIGS. 2A to 2D are given the same Reference Numerals.

As shown in FIG. 3A, the insulator film 2 is formed on the silicon substrate 1 in which various semiconductor circuit elements (not shown) are formed and the first silicon conductive layer 1A constitutes a portion of one of the semiconductor circuit elements. The contact hole 3 is formed to penetrate through the insulator film 2 and to reach the surface of the first silicon conductive layer 1A. Thereafter, a titanium film 4 is formed at a bottom of the contact hole 3, to directly contact with the surface of the first silicon conductive layer 1A within the contact hole 3, and furthermore, a titanium nitride film is formed to fill up the contact hole 3 and to cover the insulator film 2. Thereafter, the titanium nitride film is removed from the planar upper surface of the insulator film 2, so that a titanium nitride plug 5 filling up the contact hole 3 is formed. Here, the titanium film 4 reacts with the silicon of the substrate so that a titanium silicide film 4A is formed between the titanium nitride plug 5 and the first silicon conductive layer 1A.

Then, as shown in FIG. 3B, a tungsten film 9 having a thickness of 10 nm is selectively formed on the titanium nitride plug 5 by means of a plasma chemical vapor deposition process under conditions in which the substrate temperature is 250° C., the flow rate of tungsten hexafluoride ($WF_6$) is 2 sccm, the flow rate of hydrogen is 10 sccm, the flow rate of argon is 20 sccm, and the pressure is 50 mTorr.

Thereafter, as shown in FIG. 3C, a polysilicon electrode 6 doped with a predetermined impurity is formed on the tungsten film 9 and the insulator film 2 in the neighborhood of the conducting plug 5.

Furthermore, a predetermined heating treatment is conducted to cause the tungsten film 9 to react with the polysilicon electrode 6, thereby to form a tungsten silicide film 10, as shown in FIG. 3D. Thus, the polysilicon electrode 6 is electrically connected through the tungsten silicide film 10 to the titanium nitride plug 5, without being directly contacted with the polysilicon electrode 6. In this case, the contact resistance between the polysilicon electrode 6 and the titanium nitride plug 5 becomes remarkably smaller than the prior art in which the polysilicon electrode 6 is in direct contact with the titanium nitride plug 5.

In the above mentioned processes, the titanium silicide film 4A was formed before formation of the titanium film 7 or the tungsten film 9. However, as shown by the parenthesized legend "(4 Ti FILM)" in FIGS. 2B and 2C and FIG. 3B and 3C, it would be a matter of course to persons skilled in the art that to modify the process so that the metal titanium film 4 is maintained until the heat treatment for forming the titanium silicide film 8 or the tungsten silicide film 10, and when the heat treatment for forming the titanium silicide film 8 or the tungsten silicide film 10 is carried out, the metal titanium film 4 is caused to react with the silicon substrate so as to form the titanium silicide film 4A.

In addition, it would also be a matter of course to persons skilled in the art that, in the above mentioned embodiments, the titanium nitride plug 5 can be replaced with a tungsten plug.

As seen from the above, according to the present invention, it is possible to reduce the contact resistance between a polysilicon electrode and a metal-based plug such as a titanium nitride plug and a tungsten plug, as compared with the prior art. Therefore, it is possible to achieve electric characteristics more stable than prior art and an operation speed of the integrated circuit higher than the prior art.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device including a first conductive silicon layer, an insulator layer formed to cover a surface of said first conductive silicon layer, said insulator layer having a top surface and a bottom surface, a contact hole formed to penetrate through said insulator layer to said surface of said first conductive silicon layer, a conductive body formed to fill said contact hole to the top surface of said insulator layer, and an electrode formed on said conductive body, said conductive body including first and second silicide films formed on a bottom surface and a top surface of said conductive body, respectively, and extending beyond the top surface and the bottom surface of said insulator layer, respectively, so that said conductive body is electrically connected to said first conductive silicon layer through said first silicide film and to said electrode through said second silicide film.

2. A semiconductor device claimed in claim 1 wherein said conductive body is formed of a material selected from the group consisting of titanium nitride and tungsten.

3. A semiconductor device claimed in claim 2 wherein said silicide films are formed of a material selected from the group consisting of titanium silicide and tungsten silicide.

4. A semiconductor device claimed in claim 1 wherein said conductive body is formed of titanium nitride, said silicide films are formed of titanium silicide, and said electrode is formed of a second conductive silicon layer.

5. A semiconductor device claimed in claim 1 wherein said conductive body is formed of titanium nitride, said first and second silicide films are formed of titanium silicide and tungsten silicide, respectively, and said electrode is formed of a second conductive silicon layer.

6. A semiconductor device including a first conductive silicon layer, an insulator layer formed to cover said first conductive silicon layer, a contact hole formed to penetrate through said insulator layer to reach a surface of said first conductive silicon layer, a titanium nitride conductive body formed to fill up said contact hole, and an electrode formed of a second conductive silicon layer formed on said titanium nitride conductive body, said conductive body including first and second titanium silicide films formed on a bottom surface and a top surface of said titanium nitride conductive body, respectively, so that said titanium nitride conductive body is electrically connected to said first conductive silicon layer through said first titanium silicide film and to said electrode through said second titanium silicide film.

7. A semiconductor device including a first conductive silicon layer, an insulator layer formed to cover said first conductive silicon layer, a contact hole formed to penetrate through said insulator layer to reach a surface of said first conductive silicon layer, a titanium nitride conductive body formed to fill up said contact hole, and an electrode formed of a second conductive silicon layer formed on said titanium nitride conductive body, said conductive body including first and second silicide films formed respectively of titanium silicide and tungsten silicide formed on a bottom surface and a top surface of said titanium nitride conductive body, respectively, so that said titanium nitride conductive body is electrically connected to said first conductive silicon layer through said first silicide film and to said electrode through said second silicide film.

* * * * *